(12) United States Patent
Kim et al.

(10) Patent No.: US 8,982,112 B2
(45) Date of Patent: Mar. 17, 2015

(54) DISPLAY PANEL

(75) Inventors: Sung Gyu Kim, Yongin (KR); Jae Mo Jung, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 390 days.

(21) Appl. No.: 13/345,842

(22) Filed: Jan. 9, 2012

(65) Prior Publication Data
US 2012/0299888 A1  Nov. 29, 2012

(30) Foreign Application Priority Data
May 26, 2011 (KR) .................. 10-2011-0050312

(51) Int. Cl.
*G06F 3/038* (2013.01)
*G09G 5/00* (2006.01)
*G02F 1/1345* (2006.01)
*H05K 3/36* (2006.01)
*H05K 1/11* (2006.01)
*H05K 3/32* (2006.01)

(52) U.S. Cl.
CPC .. *G02F 1/13452* (2013.01); *H05K 2201/09481* (2013.01); *H05K 2201/09781* (2013.01); *H05K 2201/10128* (2013.01); *H05K 1/11* (2013.01); *H05K 3/361* (2013.01); *H05K 2201/0979* (2013.01); *H05K 3/323* (2013.01); *G02F 1/13458* (2013.01)
USPC ............................ 345/211; 345/213; 345/214

(58) Field of Classification Search
None
See application file for complete search history.

(56) References Cited

U.S. PATENT DOCUMENTS

| | | | | |
|---|---|---|---|---|
| 6,100,957 | A * | 8/2000 | Kawada et al. ............... | 349/149 |
| 6,366,331 | B1 | 4/2002 | Sakamoto et al. | |
| 6,608,663 | B2 | 8/2003 | Sakamoto et al. | |
| 2002/0079591 | A1 * | 6/2002 | Sakiyama et al. ............ | 257/777 |
| 2004/0263758 | A1 * | 12/2004 | Lee et al. ...................... | 349/150 |
| 2008/0024475 | A1 * | 1/2008 | Takenaka et al. ............ | 345/206 |

FOREIGN PATENT DOCUMENTS

| | | | | |
|---|---|---|---|---|
| KR | 10 2000-0065437 A | 11/2000 | | |
| KR | 10 2005-0003497 A | 1/2005 | | |
| KR | 20050003497 A * | 12/2005 | ............ | G02F 1/1345 |

OTHER PUBLICATIONS

Hwang, Han-Uk, Chip-on-glass type Liquid Crystal Display, Jan. 2005, B1, pp. 1-21.*

* cited by examiner

*Primary Examiner* — Dwayne Bost
*Assistant Examiner* — Maheen Javed
(74) *Attorney, Agent, or Firm* — Lee & Morse, P.C.

(57) ABSTRACT

Embodiments may be directed to a display panel includes a base substrate including a display region having a plurality of pixels and a non-display region adjacent to the display region, a connecting line in the non-display region and including at least a first input pad, a second input pad, and an output pad, and an insulating layer on the connecting line. The insulating layer includes at least one first contact hole exposing at least a portion of the first input pad, at least one second contact hole exposing at least a portion of the second input pad, and at least one third contact hole between the first contact hole and the second contact hole. A first contact electrode, a second contact electrode, and a dummy contact electrode are disposed at the first, second and third contact holes, respectively.

17 Claims, 11 Drawing Sheets

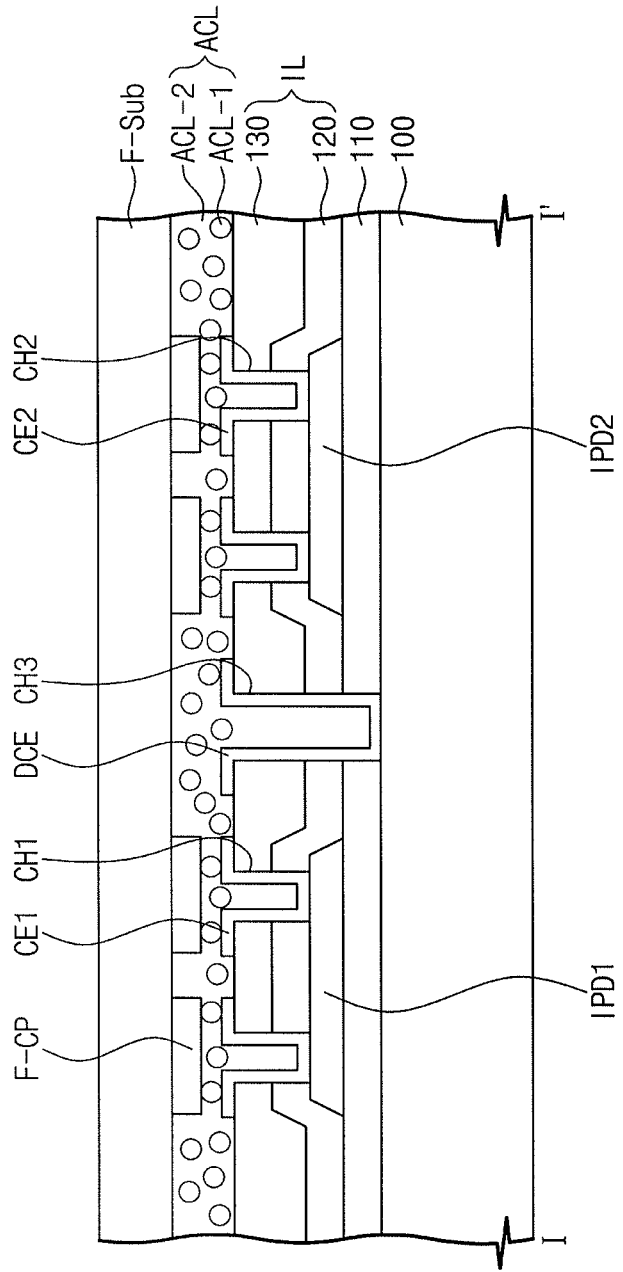

DISPLAY PANEL

CROSS-REFERENCE TO RELATED APPLICATION

This U.S. non-provisional patent application claims priority under 35 U.S.C. §119 to Korean Patent Application No. 10-2011-0050312, filed on May 26, 2011, the entirety of which is incorporated by reference herein.

BACKGROUND

1. Field

Embodiments relate to a display panel.

2. Description of the Related Art

Generally, a display panel includes a display region having a plurality of pixels and a non-display region adjacent to the display region. Each of the pixels includes a pixel electrode and a thin film transistor. The thin film transistor switches a pixel voltage supplied to the pixel electrode.

SUMMARY

According to embodiments, a display panel includes a base substrate including a display region having a plurality of pixels and a non-display region adjacent to the display region, a connection line in the non-display region, the connection line including at least a first input pad, a second input pad, and an output pad, and an insulating layer on the connection line. The insulating layer includes at least one first contact hole exposing at least a portion of the first input pad, at least one second contact hole exposing at least a portion of the second input pad, and at least one third contact hole between the first contact hole and the second contact hole. The display panel also includes a first contact electrode on the insulating layer, the first contact electrode connected to the first input pad through the first contact hole, a second contact electrode disposed on the insulating layer, the second contact electrode connected to the second input pad through the second contact hole, and a dummy contact electrode on the insulating layer, the dummy contact electrode extended into the third contact hole.

The third contact hole may expose a surface of the base substrate.

The display panel may further include a dummy pad between the first input pad and the second input pad. The dummy pad may be directly connected to the first input pad and the second input pad to form one body. The third contact hole may expose at least a portion of the dummy pad. The dummy contact electrode may be connected to the dummy pad. The first contact electrode, the second contact electrode, and the dummy contact electrode may be connected to each other on the insulating layer The display panel may further include a flexible circuit board providing a signal supplied from the outside. The flexible circuit board includes a flexible substrate and a plurality of signal lines on a surface of the flexible substrate. The flexible circuit board and the insulating layer are combined to each other by an anisotropic conductive adhesion layer. The anisotropic conductive adhesion layer electrically connects some of the signal lines to the first contact electrode and the second contact electrode. In this case, the first contact electrode and the second contact electrode receive a same driving voltage.

The display panel may further include a plurality of first signal lines disposed in the display region, the first signal lines on a same plane as the connection line, a plurality of second signal lines crossing over the first signal lines, the second signal lines being insulated from the first signal lines, and a plurality of pixel electrodes in the pixels, respectively.

The display panel may further include a driving circuit in the non-display region. The driving circuit is connected to the output pad and provides a driving signal to the first signal lines.

BRIEF DESCRIPTION OF THE DRAWINGS

The above and other features will become more apparent to those of ordinary skill in the art by describing in detail exemplary embodiments thereof with reference to the attached drawings in which:

FIG. 4A is another variation on the cross sectional view taken along a line I-I' of FIG. 2;

DETAILED DESCRIPTION

Example embodiments will now be described more fully hereinafter with reference to the accompanying drawings; however, they may be embodied in different forms and should not be construed as limited to the embodiments set forth herein.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of present embodiments.

Spatially relative terms, such as "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" than other elements or features would then be oriented "upper" other elements or features. Thus, the exemplary term "lower" can encompass both an orientation of lower and upper. The device may be otherwise oriented (rotated 90 degrees or at other orientations) and the spatially relative descriptors used herein interpreted accordingly.

Hereinafter, present embodiments will be explained in detail with reference to the accompanying drawings.

Figure 1:
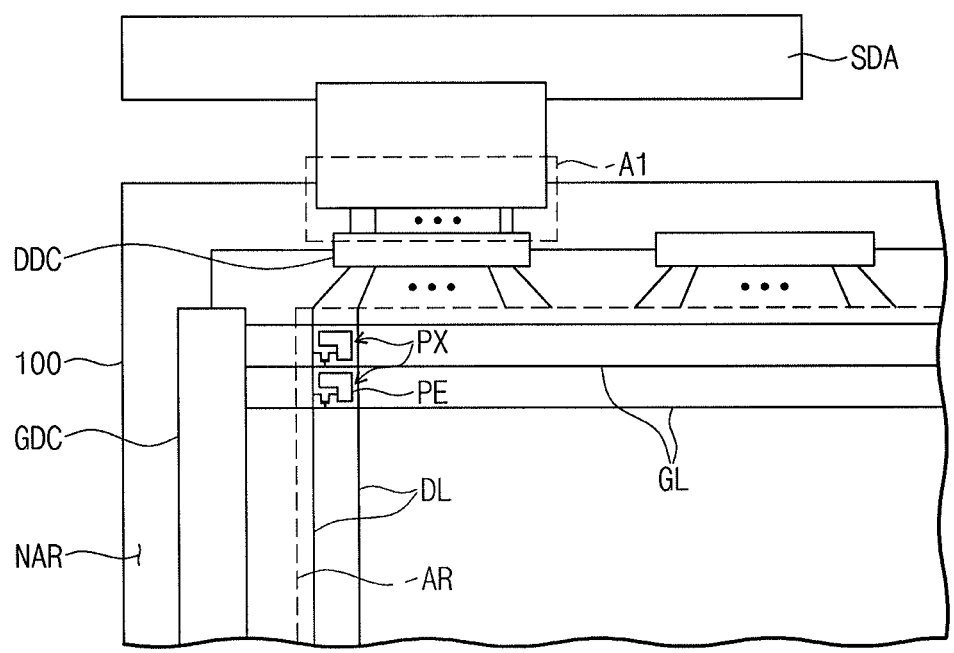
FIG. 1 is a plan view illustrating a display panel according to an embodiment.
Figure 2:
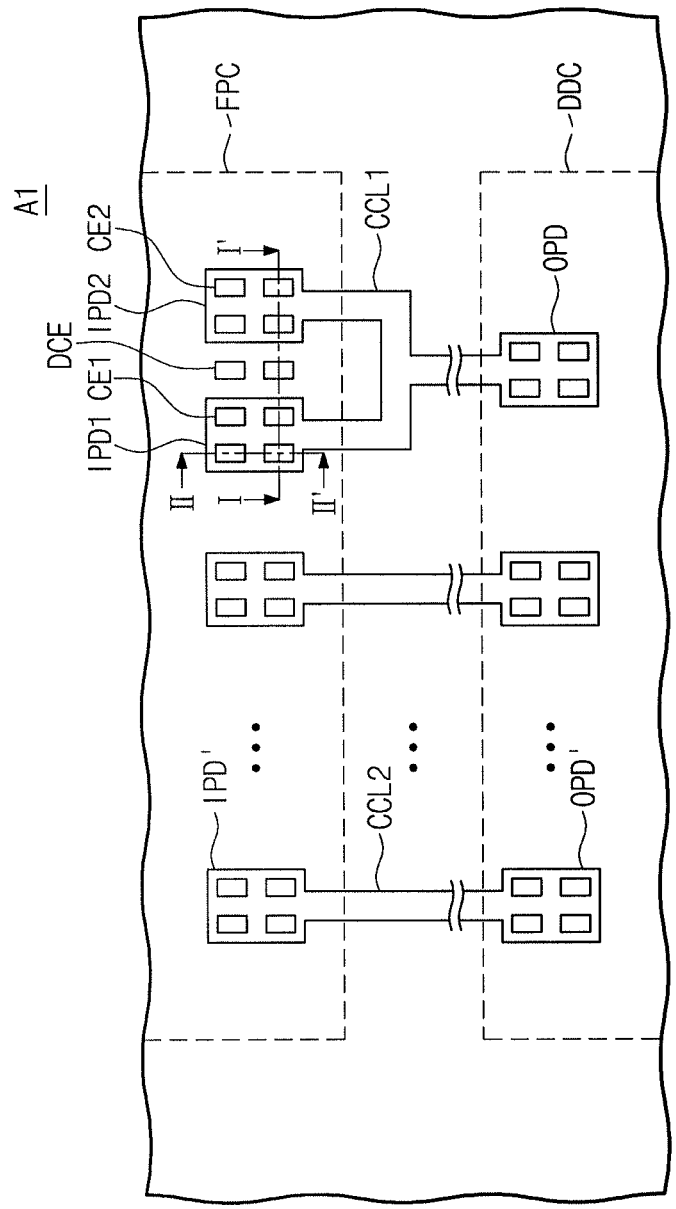
FIG. 2 is an enlarged view of a portion 'A1' of FIG. 1.
Figure 3:
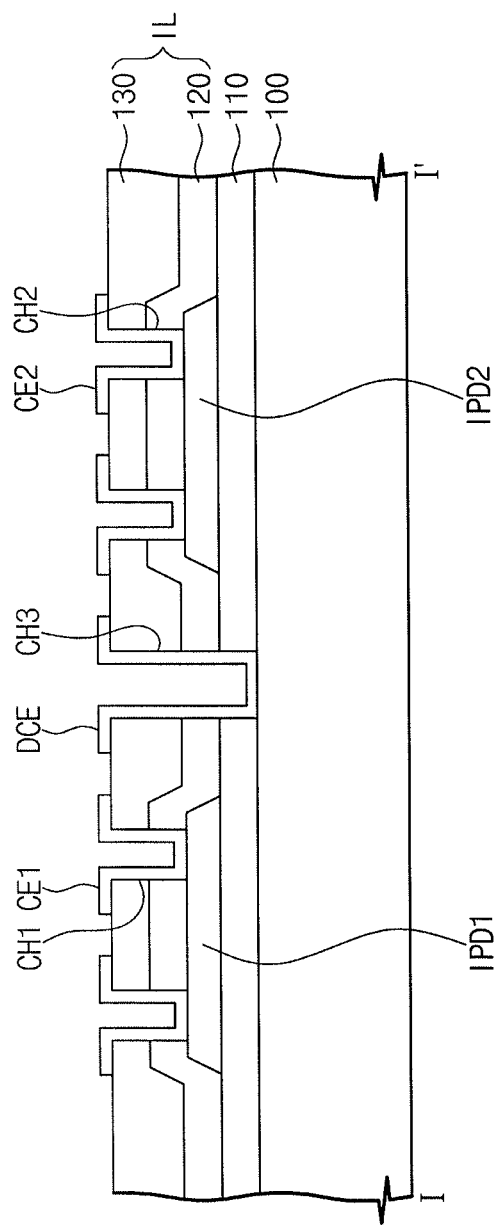
FIG. 3 is a cross sectional view taken along a line I-I' of FIG. 2 to illustrate a base substrate included in a display panel according to an embodiment.
Figure 4B:
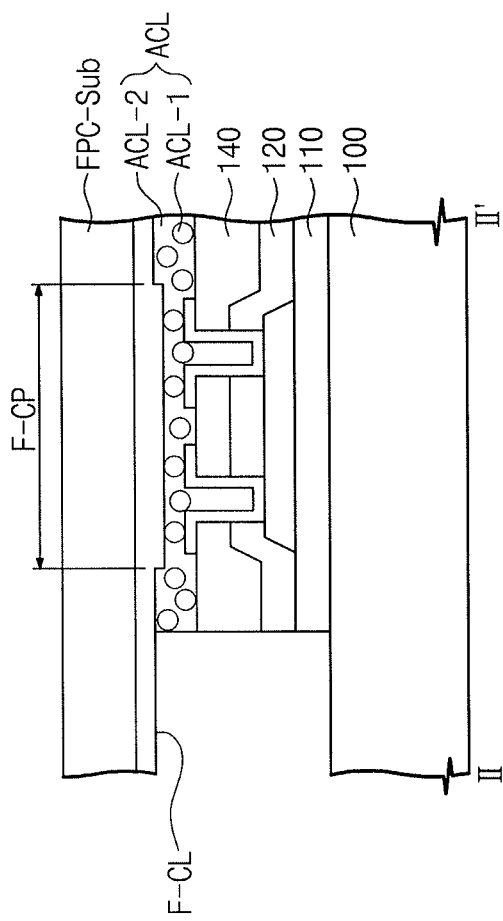
FIG. 4B is a cross sectional view taken along a line II-II' of FIG. 2.

FIG. 1 is a plan view illustrating a display panel according to an embodiment, and FIG. 2 is an enlarged view of a portion 'A1' of FIG. 1. FIG. 3 is a cross sectional view taken along a line I-I' of FIG. 2 to illustrate a base substrate included in a display panel according to an embodiment, and FIGS. 4A and 4B are cross sectional views taken along lines I-I' and II-II' of FIG. 2, respectively.

Referring to FIG. 1, a display panel according to an embodiment includes a base substrate 100 including a display region AR having a plurality of pixels PX and a non-display region NAR adjacent to the display region AR. The display region AR is a region which displays an image, and the non-display region NAR is a region which does not display an image. The base substrate 100 may be a glass substrate, a silicon substrate, or a film substrate.

A plurality of first signal lines and a plurality of second signal lines are disposed in the display region AR. The second signal lines cross over the first signal lines, and the second signal lines are insulated from the first signal lines. In the present embodiment, the first signal lines are defined as data lines DL in FIG. 1, and the second signal lines are defined as gate lines GL in FIG. 1.

Each of the pixels PX includes a pixel electrode PE and a thin film transistor TFT. Each of the pixels PX has the same elements and functions. Thus, a single pixel PX will be described as an example, and all pixels PX use the same reference numeral, hereinafter.

The thin film transistor TFT switches a pixel voltage corresponding to an image displayed through the pixel PX. The thin film transistor TFT includes a gate electrode, an active layer, a source electrode, and a drain electrode. The gate electrode is extended from one of the gate lines GL. The gate electrode includes aluminum series metal and/or a silver series metal, etc. A first insulating layer (110 in FIG. 3) is formed on the base substrate 100 to cover the gate lines GL and the gate electrode. The first insulating layer (110 in FIG. 3) is formed of silicon nitride (SiNx) and/or silicon oxide, etc. The active layer is formed on the first insulating layer. The active layer is formed of a hydrogenated amorphous silicon and/or polycrystalline silicon, etc. The source electrode and the drain electrode are formed on the active layer. The source electrode and the drain electrode are apart from each other to expose the active layer. Also, the data lines DL are formed on the first insulating layer. The source electrode is extended from the data line DL.

Ohmic contact layers may be interposed between the active layer and the source electrode and between the active layer and the drain electrode. The ohmic contact layers are made of a silicide and/or a n+ hydrogenated amorphous silicon being doped with n type dopants of high concentration, etc. The ohmic contact layers may have various shapes, i.e., an island shape or a linear shape, etc.

A second insulating layer (120 in FIG. 3) is formed on the first insulating layer to cover the source electrode, the drain electrode, and the exposed active layer. The second insulating layer is formed of an inorganic material, i.e., silicon nitride or silicon oxide, an organic material having an excellent planarization characteristic and photosensitivity, or a low-k insulating material, i.e., a-Si:C:O or a-Si:O:F formed by a plasma enhanced chemical vapor deposition (PECVD) process. The second insulating layer may have a dual layered structure with a lower inorganic layer and an upper organic layer for having the excellent characteristics of the organic material and protecting the exposed active layer.

A contact hole is formed through the second insulating layer to expose a portion of the drain electrode. The pixel electrode PE corresponding to the pixel PX is formed on the second insulating layer. The pixel electrode PE is electrically connected to the drain electrode through the contact hole. The pixel electrode PE is formed of a transparent conductive material, i.e., indium tin oxide (ITO) or indium zinc oxide (IZO), or a reflective conductive material, i.e., aluminum.

In an embodiment, a planarization layer (130 in FIG. 3) may be formed on the second insulating layer. In this case, the contact hole may sequentially penetrate the planarization layer and the second insulating layer, and the pixel electrode PE may be formed on the planarization layer.

As illustrated in FIGS. 1 and 2, the display panel further includes a first connection line CCL1 which is disposed in the non-display region NAR and has at least two input pads and an output pad OPD. In FIG. 2, the first connection line CCL1 may include a first input pad IPD1 and a second input pad IPD2, but it should not be limited thereto. Also, the display panel further includes second connection line CCL2 in the non-display region NAR. Each of the second connection lines CCL2 is parallel with the first connecting interconnection CCL1 and includes an input pad IPD' and an output pad OPD'.

The first input pad IPD1 and the second input pad IPD2 of the first connection line CCL1 receives a signal supplied from a system controller SDA through a flexible circuit board FPC. The first input pad IPD1 and the second input pad IPD2 receive the same signal. The signal may be a common voltage or a driving voltage. The driving voltage may be a ground voltage, or a power voltage having a predetermined potential.

The output pad OPD of the first connection line CCL1 is connected to a driving circuit. The driving circuit, as illustrated in FIG. 1, may be a data driving circuit DDC being disposed in the non-display region NAR of the base substrate 100. The data driving circuit DDC receives a data control signal supplied through the second connection line CCL2 to provide the data line DL with a data driving signal. Meanwhile, when the first input pad IPD1 and the second input pad IPD2 receive a common voltage signal, the output pad OPD is connected to a common voltage line (not shown).

A combined relation of the base substrate 100 and the flexible circuit board FPC will be described with reference to FIGS. 2, 3 4A and 4B in more detail.

As illustrated in FIGS. 2 and 3, an insulating layer IL is disposed on the first connection line CCL1. When the first connection line CCL1 is disposed on the same plane as the data line DL (i.e., when the first connection line CCL1 is disposed directly on the first insulating layer 110), the insulating layer IL includes the second insulating layer 120 and the planarization layer 130.

The insulating layer IL includes a first contact hole CH1 exposing at least a portion of the first input pad IPD1, and a second contact hole CH2 exposing at least a portion of the second input pad IPD2. Also, the insulating IL further includes a third contact hole CH3 between the first contact hole CH1 and the second contact hole CH2. Each of the first contact hole CH1, the second contact hole CH2, and the third contact hole CH3 may be provided in a plural number. Four first contact holes CH1, four second contact holes CH2, and two third contact holes CH3 are shown in FIG. 2, but it should not be limited thereto.

The third contact hole CH3, as illustrated in FIG. 3, may have a depth for exposing the base substrate 100. However, the depth of the third contact hole CH3 should not be limited thereto. The third contact hole CH3 may have a depth for exposing the first insulating layer 110 or the second insulating layer 120.

A first contact electrode CE1 and a second contact electrode are disposed in the first contact hole CH1 and the second contact hole CH2, respectively. A dummy contact electrode DCE is disposed in the third contact hole CH3. Each of the first contact electrode CE1, the second contact electrode CE2 and the dummy contact electrode DCE may be formed of a transparent conductive material, i.e., indium-tin oxide.

In more detail, the first contact electrode CE1 is disposed on the insulating layer IL to be extended into the first contact hole CH1. Thus, the first contact electrode CE1 is connected to the first input pad IPD1 through the first contact hole CH1. The second contact electrode CE2 is disposed on the insulating layer IL to be extended into the second contact hole CH2. Thus, the second contact electrode CE2 is connected to the second input pad IPD2 through the second contact hole CH2. The dummy contact electrode DCE is disposed on the insulating layer IL to be extended into the third contact hole CH3.

The first contact electrode CE1 and the second contact electrode CE2 have a function to transfer a signal supplied through the flexible circuit board FPC to the first input pad IPD1 and the second input pad IPD2. The dummy contact electrode DCE has a function to improve a combined strength of the flexible circuit board FPC and the base substrate 100.

The flexible circuit board FPC, as illustrated in FIGS. 4A and 4B, includes a flexible substrate F-sub and a plurality of signal lines F-CL on a surface of the flexible substrate F-sub. Each of the signal lines F-CL includes a connecting pad F-CP disposed at its end. The flexible circuit board FPC and the base substrate 100 are combined to each other by an anisotropic conductive adhesion layer ACL. The anisotropic conductive adhesion layer ACL is interposed between a top surface of the insulating layer IL of the base substrate 100 and the connecting pads F-CP of the signal lines F-CL.

The anisotropic conductive adhesion layer ACL includes an insulating adhesive ACL-2 and conductive particles ACL-1 dispersed in the insulating adhesive ACL-2. When the anisotropic conductive adhesion layer ACL is pressed by an external pressure, the conductive particles ACL-1 are interposed between the connecting pad F-CP of one of the signal lines F-CL and the first contact electrode CE1 to electrically connect the connecting pad F-CP of one of the signal lines F-CL to the first contact electrode CE1. The second contact electrode CE2 is connected to the connecting pad F-CP of another of the signal lines F-CL by the same method as the electrically connection of the first contact electrode CE1 and the connecting pad F-CP of one of the signal lines F-CL.

The insulating adhesive ACL-2 is interposed between a region of the flexible circuit board FPC on which the connecting pads F-CP are formed, and a region of the insulating layer IL on which the first contact electrode CE1, the second contact electrode CE2, and the dummy contact electrode DCE are formed. A bonding strength of the dummy contact electrode DCE and the insulating adhesive ACL-2 is stronger than a bonding strength of the insulating layer IL and the insulating adhesive ACL-2. As a result, because the display panel includes the dummy contact electrode DCE, the combined strength of the flexible circuit board FPC and the base substrate 100 is improved.

Figure 5:
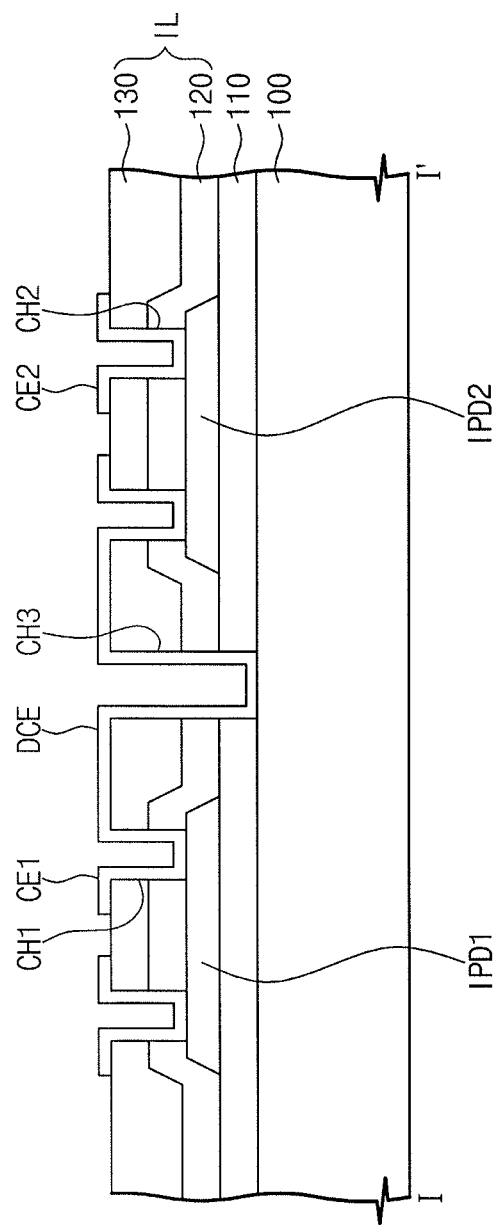
FIG. 5 is a cross sectional view taken along a line I-I' of FIG. 2 to illustrate a display panel according to another embodiment.

FIG. 5 is a cross sectional view taken along a line I-I' of FIG. 2 to illustrate a display panel according to another embodiment. As illustrated in FIG. 5, the first contact electrode CE1, the second contact electrode CE2, and the dummy contact electrode DCE may be connected to each other on the insulating layer IL. Thus, planar areas of portions of the electrodes CE1, CE2 and DCE, which are disposed on the top surface of the insulating layer IL, can increase. As a result, a bonding strength of the insulating adhesive ACL-2 and the base substrate 100 can increase.

When a plurality of the first contact electrodes CE1 are disposed on the base substrate 100, the first contact electrodes CE1 may be connected to each other on the insulating layer IL. Also, the second contact electrodes CE2 may be connected to each other on the insulating layer IL.

Figure 6:
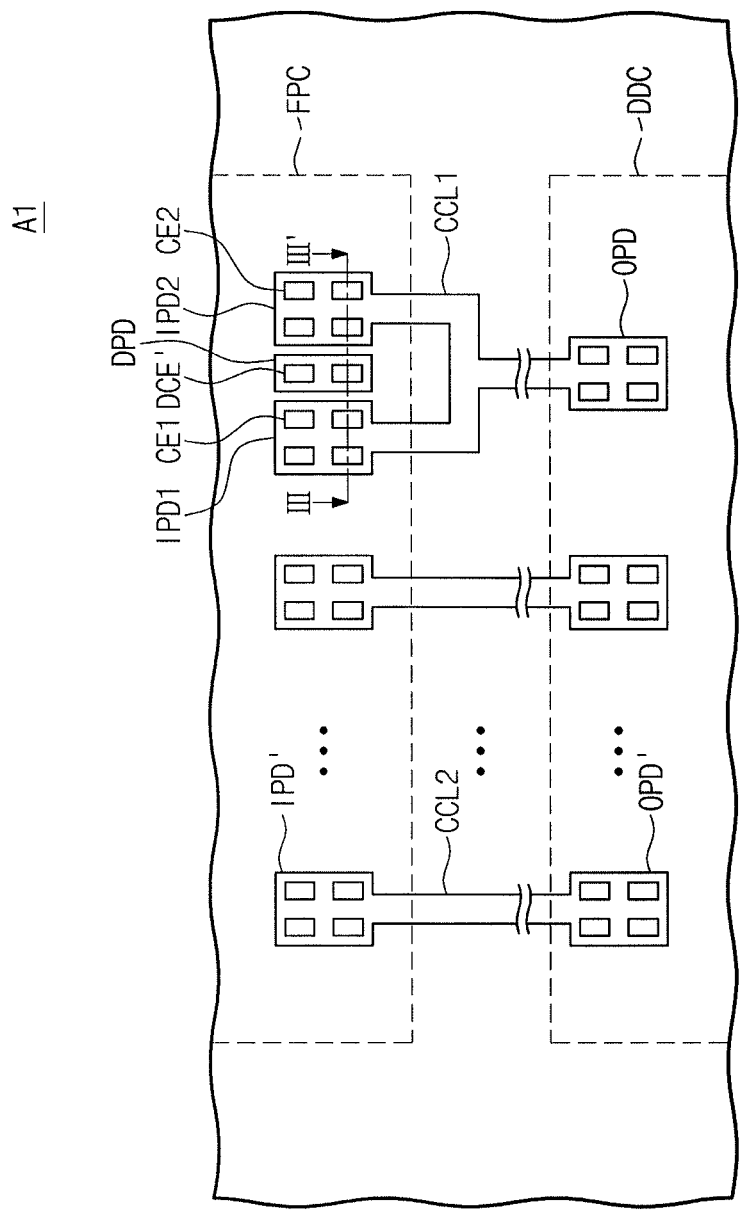
FIG. 6 is an enlarged view of a portion 'A1' of FIG. 1 to illustrate a display panel according to yet another embodiment.
Figure 7:
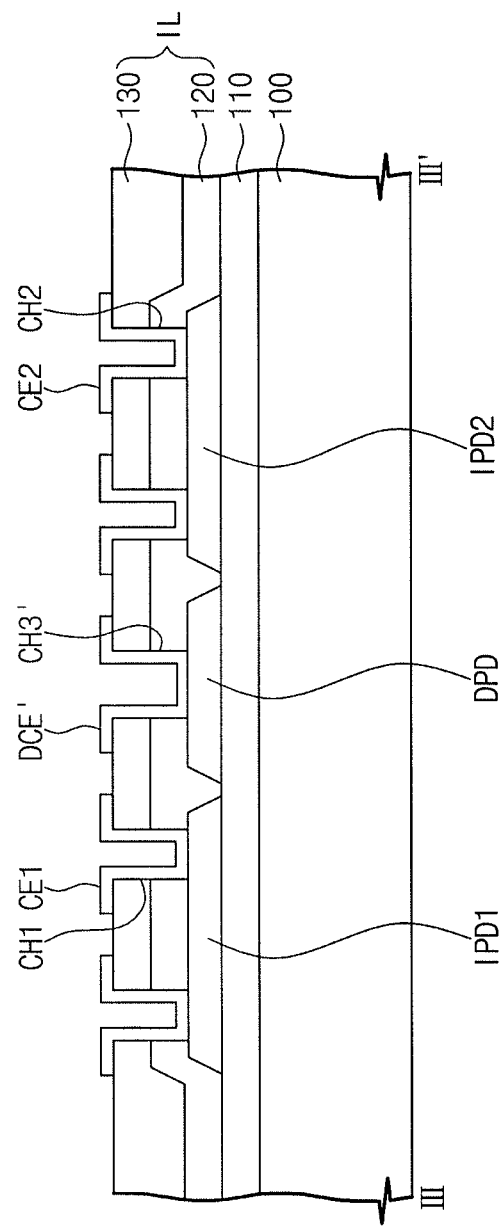
FIG. 7 is a cross sectional view taken along a line III-III' of FIG. 6.

FIG. 6 is an enlarged view of a portion 'A1' of FIG. 1 to illustrate a display panel according to yet another embodiment, and FIG. 7 is a cross sectional view taken along a line of FIG. 6. A display panel according to the present embodiment will be described hereinafter with reference to FIGS. 6 and 7. The same elements as described in FIGS. 1 to 5 will be indicated by the same reference numerals or the same reference designators. For the purpose of ease and convenience in explanation, the descriptions to the same elements as in FIGS. 1 to 5 will be omitted or mentioned briefly.

As illustrated in FIGS. 6 and 7, the base substrate 100 may further include a dummy pad DPD between the first input pad IPD1 and the second input pad IPD2. The dummy pad DPD may be disposed on the same plane as the first input pad IPD1 and the second input pad IPD2. The dummy pad DPD may be directly connected to the first and second input pads IPD 1 and IPD2 to form one body.

A third contact hole CH3' may expose at least a portion of the dummy pad DPD. A dummy contact electrode DCE' may be connected to the dummy pad DPD.

A bonding strength of the dummy contact electrode DCE' and the dummy pad DPD is stronger than a bonding strength of the dummy contact electrode DCE' and the insulating layer IL and/or a bonding strength of the dummy contact electrode DCE' and the surface of the base substrate 100. Thus, the dummy contact electrode DCE' is firmly formed in the third contact hole CH3'.

When the dummy pad DPD is connected to the first input pad IPD1 and the second input pad IPD2 which receive the same signal. The dummy contact electrode DCE' performs the same function as the first contact electrode CE1 and the second contact electrode CE2. For example, in case that the flexible circuit board FPC is misaligned with the base substrate 100, the dummy contact electrode DCE' may receive a signal from the outside to transfer the signal to the dummy pad DPD. Thus, although the flexible circuit board FPC is misaligned with the base substrate 100, the signal can be transferred to the output pad OPD of the first connection line CCL1.

Figure 8:
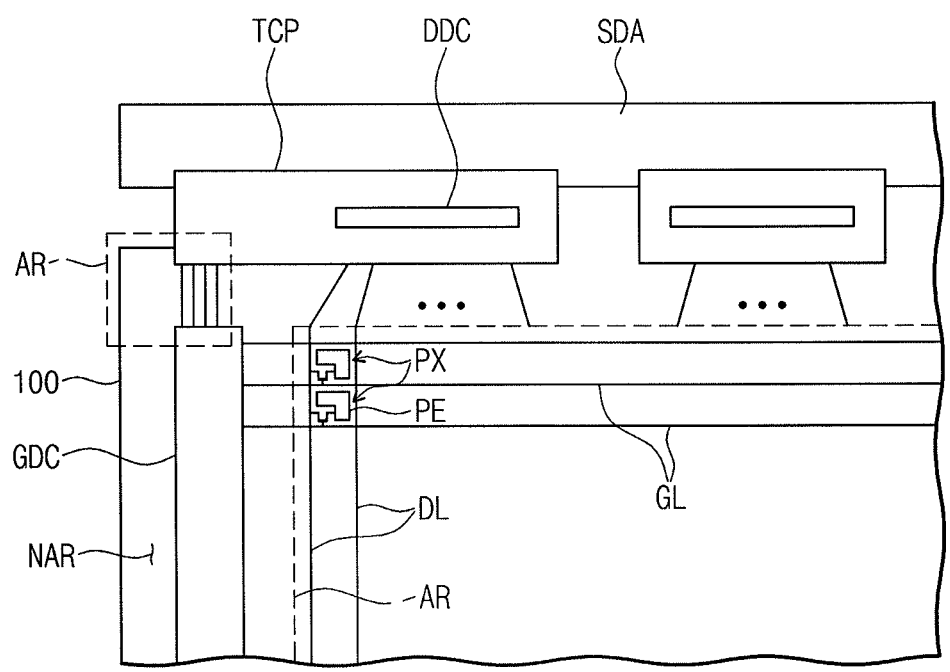
FIG. 8 is a plan view illustrating a display panel according to still another embodiment.
Figure 9:
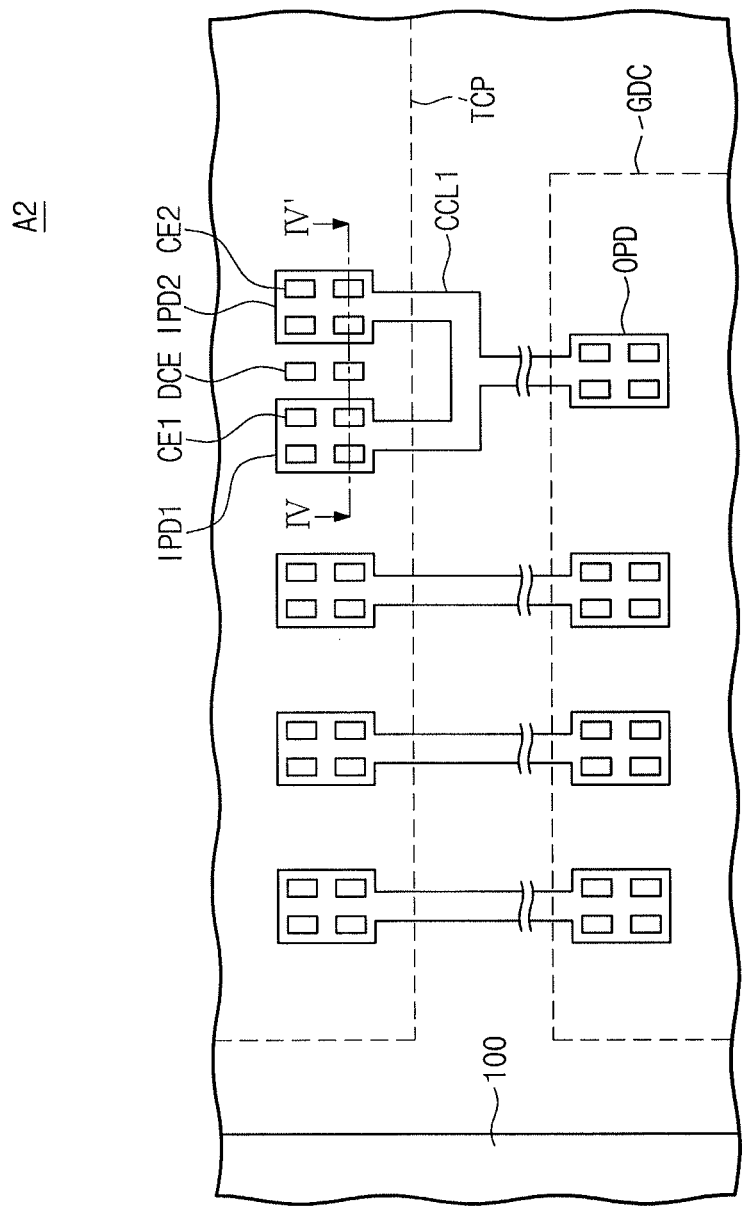
FIG. 9 is an enlarged view of a portion 'A2' of FIG. 8.
Figure 10:
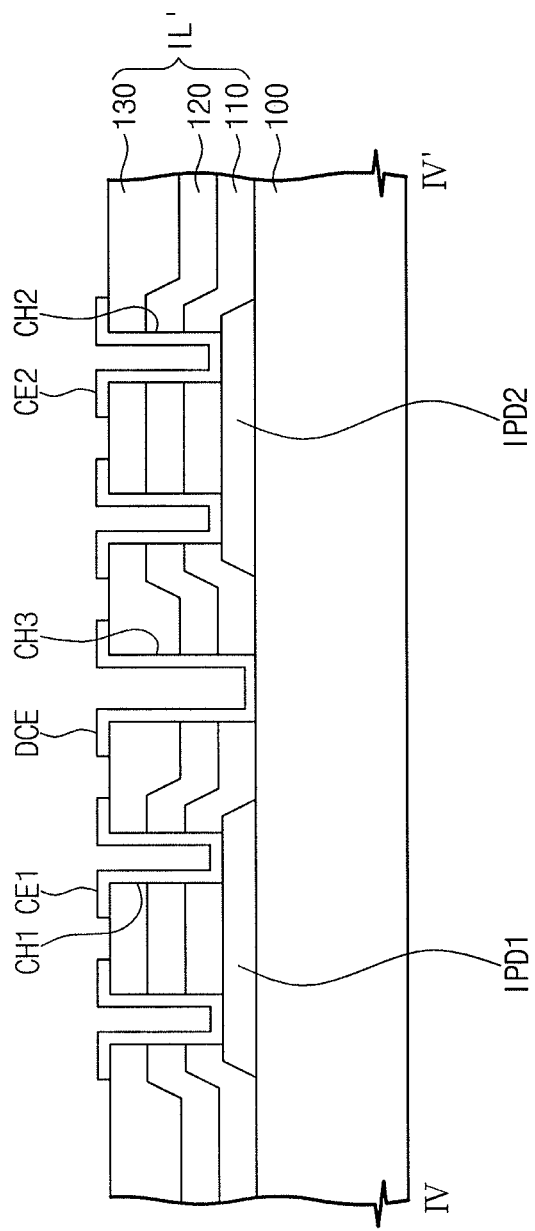
FIG. 10 is a cross sectional view taken along a line IV-IV' of FIG. 9.

FIG. 8 is a plan view illustrating a display panel according to still another embodiment, FIG. 9 is an enlarged view of a portion 'A2' of FIG. 8, and FIG. 10 is a cross sectional view taken along a line IV-IV' of FIG. 9. A display panel according to the present embodiment will be described hereinafter with reference to FIGS. 8 to 10. The same elements as described in FIGS. 1 to 7 will be indicated by the same reference numerals or the same reference designators. For the purpose of ease and convenience in explanation, the descriptions to the same elements as in FIGS. 1 to 7 will be omitted or mentioned briefly.

The display panel illustrated in FIGS. 8 to 10 includes the base substrate 100 including the display region AR having a plurality of pixels PX and the non-display region NAR adjacent to the display region AR.

A plurality of first signal lines and a plurality of second signal lines are disposed in the display region AR. The second signal lines cross over the first signal lines, and the second signal lines are insulated from the first signal lines. In the present embodiment, the first signal lines are defined as gate lines GL in FIG. 8 and the second signal lines are defined as data lines DL in FIG. 8.

Also, the display panel includes a first connection line CCL1 disposed in the non-display region NAR. The first connection line CCL1 includes the first input pad IPD1, the second input pad IPD2, and the output pad OPD. The display panel may further include second connection line CCL2 in the non-display region NAR. Each of the second connection lines CCL2 is parallel with the first connection line CCL1 and includes an input pad IPD' and an output pad OPD'.

The display panel further includes an insulating layer IL' disposed on the first connection line CCL1. As illustrated in FIGS. 8 to 10, when the first connection line CCL1 is disposed on the same plane as the gate line GL are disposed directly on the same plane (i.e., the first connection line CCL1 is disposed directly on the surface of the base substrate 100), the insulating layer IL' includes the first insulating layer 110, the second insulating layer 120, and the planarization layer 130.

The insulating layer IL' includes a first contact hole CH1, a second contact hole CH2, and a third contact hole CH3 between the first contact hole CH1 and the second contact hole CH2. A first contact electrode CE1 and a second contact hole CE2 are disposed in the first and second contact holes CH1 and CH2, respectively. A dummy contact electrode DCE is disposed in the third contact hole CH3.

The first contact electrode CE1 and the second contact electrode CE2 receives a signal supplied from the system controller SDA through a flexible circuit board to transfer the signal to the first input pad IPD1 and the second input pad IPD2.

The flexible circuit board may be a tape carrier package TCP which includes a flexible substrate and the data driving circuit DDC having a chip shape and being mounted on the flexible substrate. The tape carrier package TCP also includes the flexible substrate and a plurality of signal lines disposed on a surface of the flexible substrate. Some of the signal lines are connected to the data driving circuit DDC to provide a data driving signal to the data lines DL.

Meanwhile, some of the signal lines transfers a signal supplied from the system controller SDA directly to the first connection line CCL1 or the second connection line CCL2 on the base substrate 100. The signal received to the first connection line CCL1 may be a common voltage or a driving voltage. The driving voltage may be a ground voltage or a power voltage having a predetermined potential.

The output pad OPD of the first connection line CCL1 is connected to a gate driving circuit GDC provided in the non-display region NAR of the base substrate 100. Thus, the gate driving circuit GDC receives the power voltage or the ground voltage through the first connection line CCL1. And the gate driving circuit GDC receives a control signal supplied through the second connection line CCL2 to provide the gate lines GL with a gate driving signal.

By way of summation and review, a display panel includes a display region having a plurality of pixels and a non-display region adjacent to the display region. Each of the pixels includes a pixel electrode and a thin film transistor. The thin film transistor switches a pixel voltage supplied to the pixel electrode.

Various signals, including a driving voltage, are provided from a system controller. The system controller is not connected to a base substrate. The display panel includes a flexible circuit board for transferring the signals from the system controller to the base substrate. The flexible circuit board is combined to the base substrate by an anisotropic conductive film. However, a combined strength of the flexible circuit board and the base substrate may be weak.

Embodiments relate to a display panel capable of improving the combined strength of a flexible circuit board providing a signal supplied from the outside, and a base substrate.

Exemplary embodiments have been disclosed herein, and although specific terms are employed, they are used and are to be interpreted in a generic and descriptive sense only and not for purpose of limitation.

What is claimed is:

1. A display panel, comprising:
   a base substrate including a display region having a plurality of pixels and a non-display region adjacent to the display region;
   a flexible circuit board including a flexible substrate and a plurality of signal lines on a surface of the flexible substrate;
   a driving circuit providing a driving signal to the pixels in the display region;
   a connection line in the non-display region, the connection line including a line portion, a first pad connected to a first end of the line portion, a second pad connected to a second end of the line portion adjacent to the first end of the line portion, and a third pad connected to a third end of the line portion;
   an insulating layer on the connection line, the insulating layer including at least one first contact hole exposing at least a portion of the first pad, at least one second contact hole exposing at least a portion of the second pad, and at least one third contact hole between the first contact hole and the second contact hole;
   a first contact electrode on the insulating layer, the first contact electrode connected to the first pad through the first contact hole;
   a second contact electrode on the insulating layer, the second contact electrode connected to the second pad through the second contact hole; and
   a dummy contact electrode on the insulating layer, the dummy contact electrode extended into the third contact hole, wherein:
   the first pad and the second pad are connected to at least one of the signal lines of the flexible circuit board, and
   the third pad is connected to the driving circuit.

2. The display panel as claimed in claim 1, wherein the third contact hole exposes a surface of the base substrate.

3. The display panel as claimed in claim 1 wherein the dummy contact electrode is electrically isolated.

4. The display panel as claimed in claim 1, further comprising:
   a dummy pad between the first pad and the second pad.

5. The display panel as claimed in claim 4, wherein the dummy pad is directly connected to the first pad and the second pad to form one body.

6. The display panel as claimed in claim 4, wherein the third contact hole exposes at least a portion of the dummy pad.

7. The display panel as claimed in claim 6, wherein the dummy contact electrode is connected to the dummy pad.

8. The display panel as claimed in claim 7, wherein the first contact electrode, the second contact electrode, and the dummy contact electrode are connected to each other on the insulating layer.

9. The display panel as claimed in claim 1, further comprising
an anisotropic conductive adhesion layer combining the insulating layer with the flexible circuit board and electrically connecting some of the signal lines to the first contact electrode and the second contact electrode.

10. The display panel as claimed in claim 9, wherein the anisotropic conductive adhesion layer includes an insulating adhesive and conductive particles being dispersed in the insulating adhesive.

11. The display panel as claimed in claim 9, wherein the first contact electrode and the second contact electrode receive a same driving voltage.

12. The display panel as claimed in claim 9, wherein the anisotropic conductive adhesion layer contacts the entire surface of the dummy contact electrode.

13. The display panel as claimed in claim 9, wherein the plurality of signal lines do not include a signal line electrically connected to the dummy contact electrode.

14. The display panel as claimed in claim 9, further comprising:
a plurality of first signal lines in the display region, the first signal lines being on a same plane as the connection line;
a plurality of second signal lines crossing over the first signal lines, the second signal lines being insulated from the first signal lines; and
a plurality of pixel electrodes in the pixels, respectively.

15. The display panel as claimed in claim 14, wherein: the driving circuit is in the non-display region, and the driving circuit provides the driving signal to the first signal lines.

16. The display panel as claimed in claim 15, wherein the driving circuit is a data driving circuit providing a data driving signal to the first signal lines.

17. The display panel as claimed in claim 15, wherein the driving circuit is a gate driving circuit providing a gate driving signal to the first signal lines.

* * * * *